(12) United States Patent
Matsuda et al.

(10) Patent No.: US 7,505,022 B2
(45) Date of Patent: Mar. 17, 2009

(54) SHIFT REGISTER AND DISPLAY DEVICE

(75) Inventors: Eiji Matsuda, Matsusaka (JP);
Yuhichiroh Murakami, Matsusaka (JP);
Sachio Tsujino, Tokyo (JP); Hajime Washio, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 722 days.

(21) Appl. No.: 11/044,003

(22) Filed: Jan. 28, 2005

(65) Prior Publication Data

US 2005/0175138 A1 Aug. 11, 2005

(30) Foreign Application Priority Data

Feb. 6, 2004 (JP) ............................... 2004-031318

(51) Int. Cl.
*G09G 3/36* (2006.01)

(52) U.S. Cl. ........................... 345/100; 345/98; 345/99; 345/204; 345/205; 345/206

(58) Field of Classification Search ................. 345/100, 345/98–99, 204–205
See application file for complete search history.

(56) References Cited

U.S. PATENT DOCUMENTS 6,724,361 B1    4/2004   Washio et al.

2002/0075249 A1    6/2002   Kubota et al.

FOREIGN PATENT DOCUMENTS

| JP | 10-154818    | * | 6/1998  |
| JP | 11-282397 A  |   | 10/1999 |
| JP | 2003-228315  | * | 8/2003  |

* cited by examiner

*Primary Examiner*—Richard Hjerpe
*Assistant Examiner*—Leonid Shapiro
(74) *Attorney, Agent, or Firm*—Harness, Dickey & Pierce, P.L.C.

(57) ABSTRACT

In a shift register of the present invention, each of flip-flops has a phase difference detection section and a waveform timing forming section as a malfunction prevention circuit. The phase difference detection section detects an overlapping waveform caused by a phase difference between clock signals SCK and SCKB, and generates an output signal A (A1, A2, . . . ) from which the overlapping portions are removed. The waveform timing forming section outputs an output signal X (X1, X2, . . . ) obtained by extracting a period when the output signal A (A1, A2, . . . ) generated in a corresponding phase difference detection section is High, when an output signal Q (Q1, Q2, . . . ) from a corresponding flip-flop is High. The output signal X (X1, X2, . . . ) sets a flip-flop in a following stage. According to the above arrangement, it is possible to realize a shift register which does not malfunction and functions properly even in cases where two clock signals SCK and SCKB inputted to the shift register and having different phases from each other are out of phase. It is also possible to realize a display device having the shift register.

17 Claims, 10 Drawing Sheets

SHIFT REGISTER AND DISPLAY DEVICE

This Nonprovisional application claims priority under 35 U.S.C. § 119(a) on Patent Application No. 2004/031318 filed in Japan on Feb. 6, 2004, the entire contents of which are hereby incorporated by reference.

FIELD OF THE INVENTION

The present invention relates to a shift register which is suitably used in a drive circuit of a display device, and also relates to a display device using the shift register.

BACKGROUND OF THE INVENTION

In a display device such as an image display device, a data signal line drive circuit and a scanning signal line drive circuit are provided in order to drive a plurality of pixels, so that the pixels generate an image. Conventionally, in the data signal line drive circuit and the scanning signal line drive circuit, shift registers have been widely used for determining the timing when an inputted image signal is sampled, or for generating a scanning signal to be inputted to each of scanning signal lines.

As this type of shift register, the present applicant proposed an arrangement of a circuit shown in FIG. 9 (Document 1).

As illustrated in FIG. 9, in each stage of a shift resister 101, a set-reset type flip-flop 102 ("SR-FF" in FIG. 9) and an analog switch 103 are provided. To the shift register 101, a start pulse SSP and two clock signals SCK and SCKB whose phases are different from each other are inputted.

When a set signal inputted to an S terminal becomes active, the set-reset type flip-flop (hereinafter referred to as flip-flop) 102 is set, so that an output signal Q (Q1, Q2, . . . ) from a Q terminal becomes High (High level). Even when the set signal becomes inactive, this state of the output is maintained. When a reset signal inputted to an R terminal becomes active, the flip-flop 102 is reset, so that the output signal Q becomes Low (Low level). Even when the reset signal becomes inactive, this state of the output is maintained until when the set signal becomes active again.

In the flip-flops 102, the start pulse SSP is inputted as the set signal to a flip-flop 102-1 in a first stage placed at the leftmost of FIG. 9. To each of the flip-flops 102 in and after a second stage, an output signal X (X1, X2, . . . ) is inputted as the set signal, the output signal X (X1, X2, . . . ) outputted from an analog switch 103 corresponding to the flip-flop in a stage before a stage of the flip-flop 102 to which the output signal X (X1, X2, . . . ) is inputted. Moreover, to each of the flip-flops 102, an output signal X (X2, X3, . . . ) is inputted as the reset signal, the output signal X (X2, X3, . . . ) outputted from an analog switch 103 corresponding to the flip-flop in a stage after a stage of the flip-flop 102 to which the output signal X (X2, X3, . . . ) is inputted.

Each of the analog switches 103 is in an ON state while a corresponding flip-flop 102 is outputting an output signal Q (Q1, Q2, . . . ), and the analog switch 103 outputs the clock signal SCK or the clock signal SCKB as the output signal X (X1, X2, . . . ). The output signal X (X1, X2, . . . ) is outputted as an output signal of the shift register. Specifically, each of the analog switches 103 corresponding to the flip-flops 102 in odd stages outputs the clock signal SCK, and each of the analog switches 103 corresponding to the flip-flops 102 in even stages outputs the clock signal SCKB.

Note that, an inverter 104 in each of the analog switches 103 is provided for supplying control signals, which are opposite to each other, to gates of a PMOS transistor and a NMOS transistor which compose the analog switch 103 and are provided in parallel.

As described above, the clock signal SCK or the clock signal SCKB, both of which are the output signals X, is inputted to the flip-flop 102 in a following stage (a stage after a stage from which the output signal X is outputted) as the set signal. Meanwhile, the clock signal SCK or the clock signal SCKB is also inputted to the flip-flop 102 in a preceding stage (a stage before a stage from which the output signal X is outputted) as the reset signal.

In the above-described arrangement, the start pulse SSP is inputted as the set signal to the flip-flop 102-1 in the first stage, so that the flip-flop 102-1 is set. Then, the output signal Q1 becomes High.

The output signal Q1 from the flip-flop 102-1 becomes High, so that an analog switch 103-1 corresponding to the flip-flop 102-1 in the first stage becomes ON. Then, the clock signal SCK is outputted from the analog switch 103-1, as the output signal X1. The output signal X1 is outputted as an output signal from the first stage of the shift register 101.

Moreover, the output X1, which is the clock signal SCK, is inputted to a flip-flop 102-2 in a second stage as the set signal, so that the flip-flop 102-2 in the second stage is set. As in the above case, an output signal Q2 becomes High. The output signal Q2 from the flip-flop 102-2 in the second stage becomes High, so that an analog switch 103-2 corresponding to the flip-flop 102-2 in the second stage becomes ON. Then, the clock signal SCKB is outputted from the analog switch 103-2 as the output signal X2. The output signal X2 is outputted as an output signal from the second stage of the shift register 101.

As in the above case, the output signal X2, which is the clock signal SCKB, is inputted to a flip-flop 102-3 in a third stage as the set signal, so that the flip-flop 102-3 in the third stage is set. As a result, an output signal Q3 becomes High. Moreover, the output signal X2, which is the clock signal SCKB, is also inputted as the reset signal to the flip-flop 102-1 in the preceding stage, that is, in the first stage. Therefore, the flip-flop 102-1 in the first stage is reset, and the output signal Q1 becomes Low, and the analog switch 103-1 corresponding to the flip-flop 102-1 in the first stage becomes OFF.

In the stages of the shift register 101, a set-reset operation of the flip flops 102 and an ON/OFF operation of the analog switches 103 are successively carried out, so that the shift register 101 outputs the output signals X (X1, X2, . . . ), each of which has the same width as the width of the clock signal SCK or SCKB, and which do not overlap with each other.

Moreover, Document 2 describes a clock signal phase difference correction circuit provided in a stage before a stage in which a data line drive circuit or a scanning line drive circuit is provided. The clock signal phase difference correction circuit can surely remove phase difference between a clock signal and an antiphase clock signal which are inputted to the data line drive circuit and the scanning line drive circuit. Moreover, with the clock signal phase difference correction circuit, it is not necessary to increase a layout area of the drive circuit.

(Document 1)
Japanese Unexamined Patent Publication No. 135093/2001 (Tokukai 2001-135093, published on May 18, 2001, Corresponding U.S. Pat. No. 6,724,361 B1, Date of patent: Apr. 20, 2004)

(Document 2)
Japanese Unexamined Patent Publication No. 282397/1999 (Tokukaihei 11-282397, published on Oct. 15, 1999)

However, according to an arrangement of the above-described conventional shift register 101, there is a problem that the shift register 101 may malfunction when the clock signals SCK and SCKB are out of phase.

The following description explains this malfunction in reference to FIG. 10. FIG. 10 is a timing diagram illustrating each operation of the shift register 101. In FIG. 10, the clock signals SCK and SCKB are out of phase. The phase of the clock signal SCKB is shifted from the phase of the clock signal SCK in a retardation direction.

The flip-flop 102-1 in the first stage is set at a rise (A) of the start pulse SSP, so that the output signal Q1 becomes High. While the output signal Q1 is High, the analog switch 103-1 corresponding to the flip-flop 102-1 in the first stage is ON, so that the clock signal SCK is outputted as the output signal X1. Then, the output signal X1 is inputted as the set signal to the flip-flop 102-2 in the second stage, so that the flip-flop 102-2 in the second stage is set at a rise (B) of the output signal X1. As a result, the output signal Q2 becomes High.

However, the phase of the clock signal SCKB is shifted from the phase of the clock signal SCK, so that there is a period when both the clock signals SCK and SCKB are High. Therefore, an unnecessary pulse PP, which corresponds to a delay (lag) of the clock signal SCKB and is illustrated by hatched lines in FIG. 10, is outputted as the output signal X2 before an original pulse PPP of the clock signal SCKB is outputted. The output signal X2 is the set signal of the flip-flop 102-3 in the third stage. Therefore, although the flip-flop 102-3 in the third stage should be set at the time of (D), it is set at the time of (C) because of the unnecessary output signal X2.

As a result, an analog switch 103-3 corresponding to the flip-flop 102-3 in the third stage outputs an output signal X3 at the time when the output signal X1 is outputted. Therefore, all the flip-flops in and after the third stage are set at the same time. As a result, the shift register 101 does not function properly, so as to malfunction.

Moreover, the phase difference between the clock signals SCK and SCKB is also generated while the clock signals SCK and SCKB are transmitting inside the shift register 101. Therefore, even in cases where the clock signal phase difference correction circuit described in Document 2 is provided at a signal input side of the shift register 101, it can only deal with the phase difference of the signals before inputted to the shift register 101. In cases where the phase difference between the clock signals SCK and SCKB is generated inside the shift register 101, the shift register 101 malfunctions after all.

SUMMARY OF THE INVENTION

The present invention was made to solve the above problems, and an object of the present invention is to realize a shift register which does not malfunction and functions properly even in cases where two clock signals inputted to the shift register and having different phases from each other are out of phase. Another object of the present invention is to realize a display device having the shift register.

To achieve the above-described objects, the shift register of the present invention in which a plurality of set-reset type flip-flops are provided and to which two clock signals whose phases are different from each other are inputted, each of the plurality of the set-reset type flip-flops includes: a phase difference detection section generating a non-overlapping clock signal obtained by removing, from a waveform of a clock signal inputted to a set-rest type flip-flop in a following stage, a portion where the waveform of the clock signal overlaps with a waveform of another clock signal; and a waveform timing forming section outputting a signal as a set signal to the set-reset type flip-flop in the following stage by using the non-overlapping clock signal generated in the phase difference detection section and an output signal from a set-reset type flip-flop in a current stage, the signal outputted as the set signal being extracted by the non-overlapping signal while the output signal from the set-reset type flip-flop in the current stage is outputted.

According to the above, the phase difference detection section provided in each stage removes, from the waveform of a clock signal inputted to the flip-flop in the following stage, a portion where the waveform of the clock signal inputted to the flip-flop in the following stage overlaps with the waveform of another clock signal, thereby generating the non-overlapping clock signal. Therefore, even when two clock signals are out of phase, and the waveforms of the two clock signals are overlapping with each other (both clock signals may be High level, or may be Low level), the phase difference detection section surely removes the portion where the waveforms of the two signals overlap with each other, thereby generating a clock signal having no overlapping portions (non-overlapping signal).

Then, the waveform timing forming section outputs a signal to the flip-flop in the following stage by using the non-overlapping clock signal and an output signal from the flip-flop in a current stage. The signal is extracted from the non-overlapping signal while the output signal of the flip-flop is outputted.

Therefore, even when two clock signals are out of phase, and some portions of the waveforms of the two clock signals are overlapping with each other, the portions where the waveforms of the two signals overlaps with each other are surely removed in each stage, so that each of the flip-flops functions by using a non-overlapping clock signal (non-overlapping signal). For this reason, a malfunction (for example, a plurality of flip-flops function (are set) at the same time) is prevented. It is therefore possible to carry out a shift operation properly.

To achieve the above-described objects, a display device of the present invention includes (i) a display section, composed of a plurality of pixels, (ii) a data signal line drive circuit, being connected to a plurality of data signal lines and supplying an image data, which is written to the pixels, to each of the data signal lines, (iii) a scanning signal line drive circuit, being connected to a plurality of scanning signal lines and supplying a scanning signal to each of the scanning signal lines, the scanning signal controlling writing of the image data to the pixels, and (iv) the shift register of the present invention, provided in at least one of the data signal line drive circuit and the scanning signal line drive circuit.

Therefore, it is possible to provide a display device which can prevent display troubles caused by the above-described malfunction of the shift register.

Additional objects, features, and strengths of the present invention will be made clear by the description below. Further, the advantages of the present invention will be evident from the following explanation in reference to the drawings.

DESCRIPTION OF THE EMBODIMENTS

The following description explains an embodiment of the present invention in reference to FIGS. 1 to 8.

A shift register of the present invention is suitably used in a data signal line drive circuit and a scanning signal line drive circuit of a display device such as an image display device. Moreover, the shift register can be applied to a device other than the display device, as long as the device needs to output output signals successively by using a plurality of clock signals whose phases are different from each other. The following description explains a case where the shift register of the present invention is applied to the data signal line drive circuit.

Figure 1:
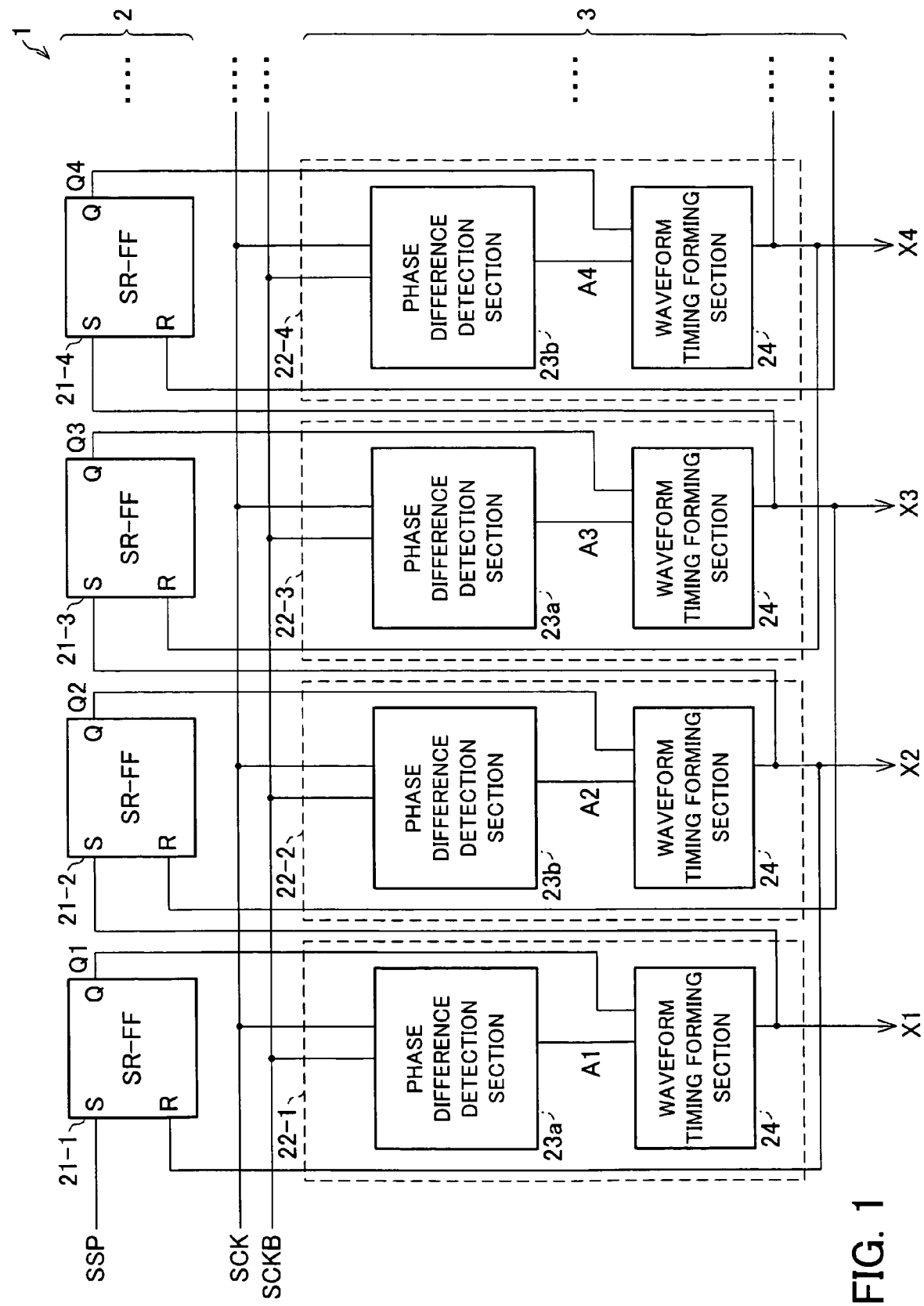
FIG. 1 is a block diagram schematically illustrating an arrangement of a shift register in accordance with one embodiment of the present invention.

As illustrated in FIG. 1, roughly speaking, a shift register 1 in accordance with the present embodiment includes a flip-flop section 2 and a malfunction prevention section 3. For example, the register 1 is used in a data signal line drive circuit 14 of a display device 11 illustrated in FIG. 2.

Figure 2:
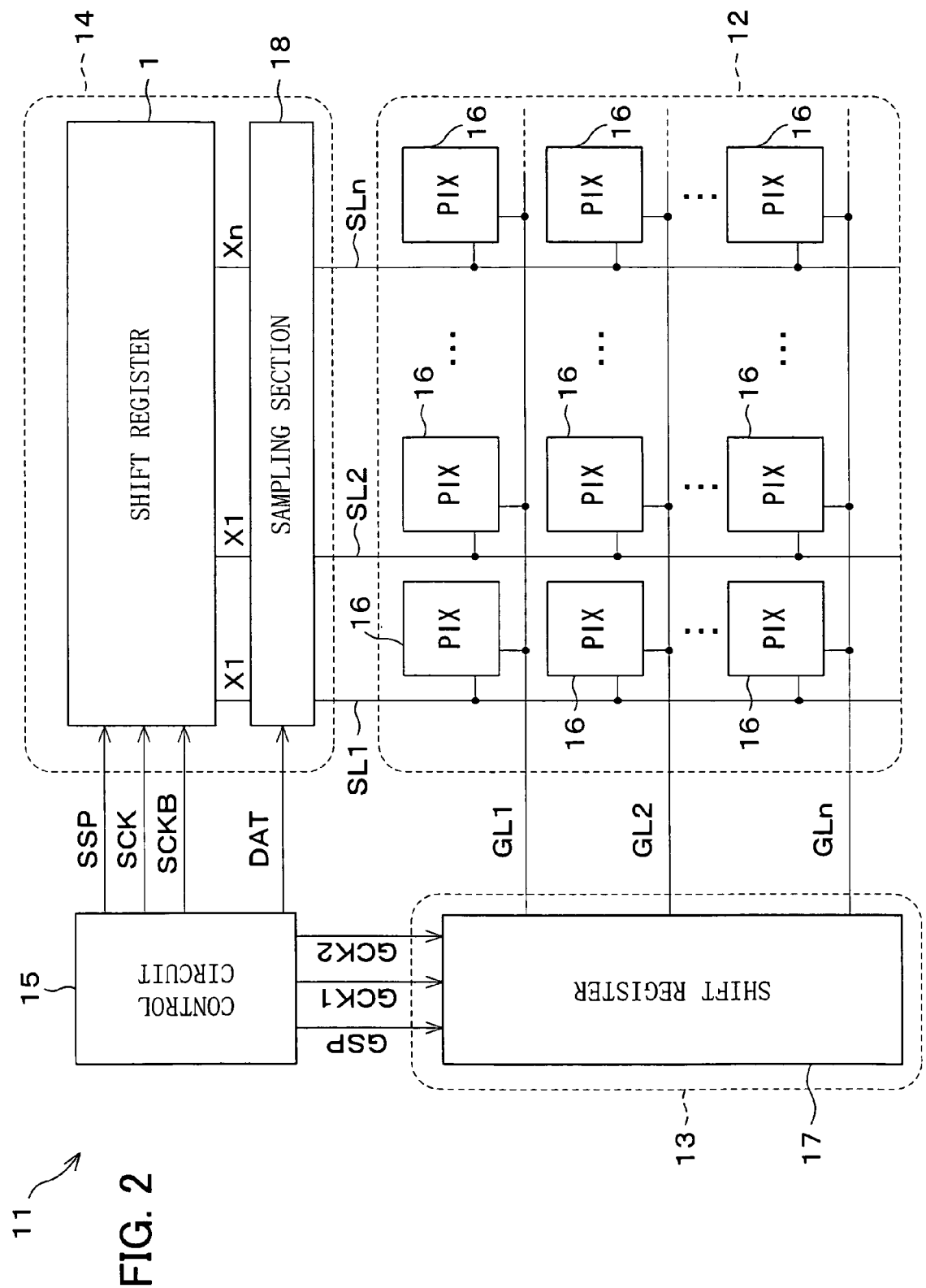
FIG. 2 is a block diagram illustrating a schematic arrangement of a display device using the shift register.
Figure 3:
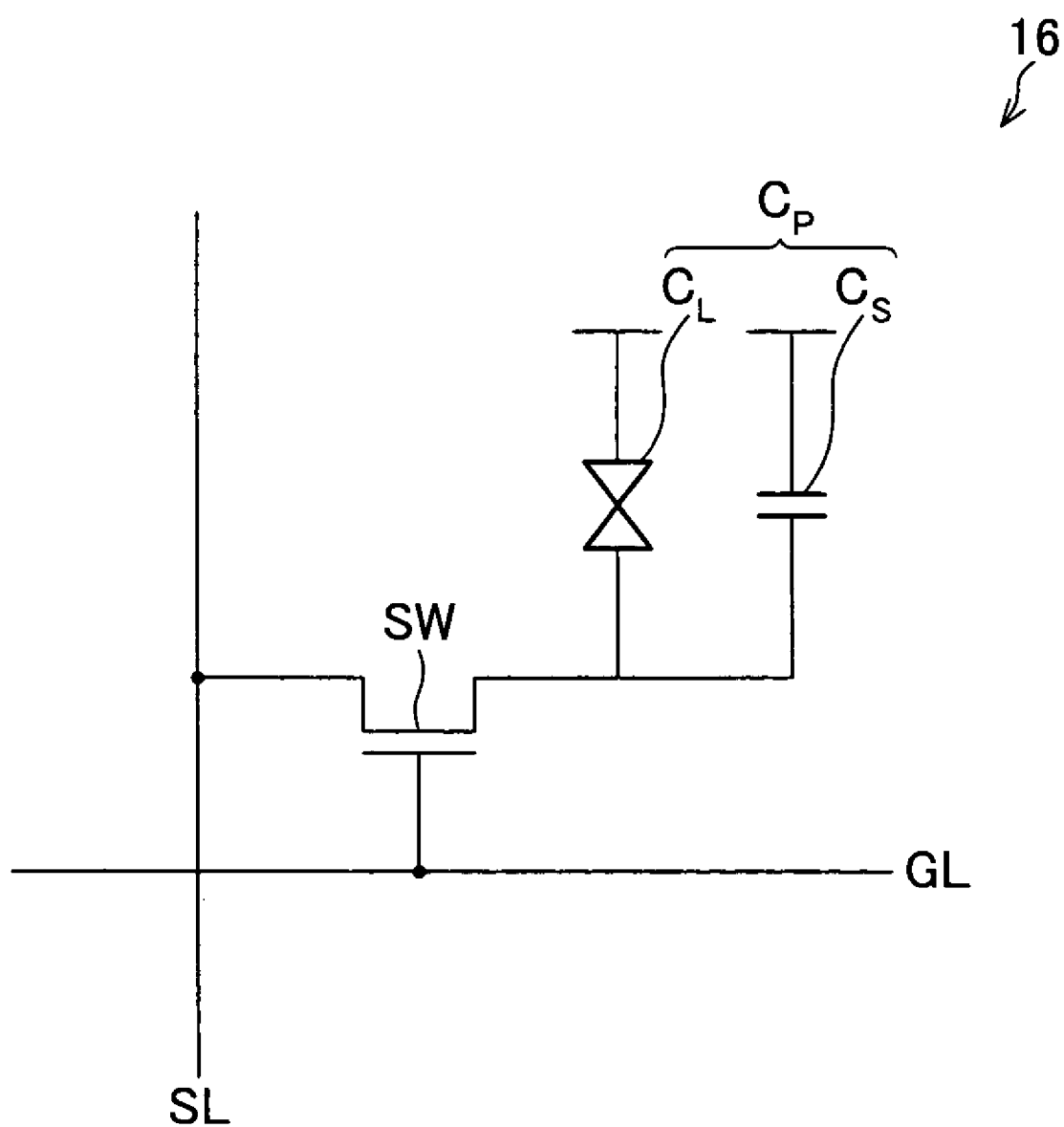
FIG. 3 is an explanatory diagram illustrating an arrangement of a pixel in the display device.

As illustrated in FIG. 2, the display device 11 includes a display section 12, a scanning signal line drive circuit 13, the data signal line drive circuit 14, and a control circuit 15.

The display section 12 includes n scanning signal lines GL (GL1, GL2, . . . , GLn) which are parallel to each other, n data signal lines SL (SL1, SL2, . . . , SLn) which are parallel to each other, and pixels ("PIX" in FIG. 2) 16 which are provided in the form of a matrix. Each of the pixels 16 is formed in a region which is surrounded by two adjacent scanning signal lines GL and two adjacent data signal lines SL. Note that, for convenience of explanation, the number of the scanning signal lines GL and the number of the data signal lines SL are set to be the same (n). However, needless to say, these numbers are not limited to this, but may be different.

The scanning signal line drive circuit 13 includes a shift register 17. The shift register 17 successively generates scanning signals, which are inputted to the scanning signal lines (GL1, GL2, . . . ) connected to pixels 16 in the respective rows, according to two kinds of signals GCK1 and GCK2 and a start pulse signal GSP inputted from the control circuit 15.

The data signal line drive circuit 14 includes the shift register 1 and a sampling section 18. From the control circuit 15 to the shift register 1, two kinds of clock signals SCK and SCKB whose phases are different from each other and a start pulse SSP are inputted. Meanwhile, from the control circuit 15 to the sampling section 18, an image signal DAT is inputted. Based on signals X1 to Xn outputted from respective stages of the shift register 1, the data signal line drive circuit 14 samples the image signal DAT in the sampling section 18, and outputs obtained image data to the data signal lines (SL1, SL2, . . . ) connected to the pixels 16 in the respective columns.

The control circuit 15 generates various control signals in order to control operations of the scanning signal line drive circuit 13 and operations of the data signal line drive circuit 14. As described above, the control signals are the clock signals GCK1, GCK2, SCK, and SCKB, the start signals GSP and SSP, the image signal DAT, and the like.

When the present display device 11 is an active matrix type liquid crystal display device, the pixel 16 is constituted by a pixel transistor SW which is made of a field effect transistor, and a pixel capacity CP including a liquid crystal capacity CL (a sub capacity CS is added according to need). In the pixel 16 constituted as above, the data signal line SL is connected with one electrode of the pixel capacity CP via a drain and a source of the pixel transistor SW, and a gate of the pixel transistor SW is connected with the scanning signal line GL, and the other electrode of the pixel capacity CP is connected with a common electrode line (not illustrated) which is commonly connected to all the pixels.

Here, assuming that a pixel 16, connected to an i-numbered data signal line SLi and a j-numbered scanning signal line GLj, is represented by PIX (i, j) (i and j are arbitrary integers in the ranges of $1 \leq i$ and $j \leq n$), on selection of the scanning signal line GLj in the PIX (i, j), the pixel transistor SW turns on so that a voltage, which has been applied to the data signal line SLi as image data, is applied to the pixel capacity CP. When a voltage is applied to the liquid crystal capacity CL in the pixel capacity CP, the transmittance or reflectance of the liquid crystal is modulated. Therefore, by selecting the scanning signal line GLj and applying a signal voltage corresponding to the image data to the data signal line SLi, the display state of the PIX (i, j) can be changed according to the image data.

In the display device 11, the scanning signal line drive circuit 13 selects a scanning signal line GL, and image data for a pixel 16 corresponding to the combination of the selected scanning signal line GL and a data signal line SL is outputted to the corresponding data signal line SL by the data signal line drive circuit 14. Thus, the image data is written to the pixel 16 connected to the selected scanning signal line GL. Moreover, the scanning signal line drive circuit 13 successively selects the scanning signal lines GL, and the data signal line drive circuit 14 outputs the image data to the data signal lines SL. As a result, the respective pieces of image data are written to all the pixels 16 of a display section 12, so that an image corresponding to the image signal DAT is displayed on the display section 12.

The image data to the respective pixels 16 is transmitted from the control circuit 15 to the data signal line drive circuit 14 as a image signal DAT in a time-divided manner, and the data signal line drive circuit 14 extracts respective pieces of image data from the image signal DAT in synchronized timing with the following timing signals: a clock signal SCK having a predetermined cycle and a duty ratio of not more than 50% (in the present embodiment, 50%); a clock signal SCKB having a 180°-phase difference from the clock signal SCK; and a start pulse SSP.

More specifically, in response to the start pulse SSP which is inputted in synchronism with the clock signals SCK and SCKB, the shift register 1 of the data signal line drive circuit 14 successively outputs pulses, each corresponding to a half cycle of the clock, while shifting the pulses, thereby generating output signals X1 to Xn which are different from each other in timing by one clock. Moreover, the sampling section 18 of the data signal line drive circuit 14 extracts the image data from the image signal DAT in synchronism with the respective output signals X1 to Xn.

In response to the start pulse GSP inputted in synchronism with the clock signals GCK1 and GCK2, the shift register 17 of the scanning signal line drive circuit 13 successively outputs pulses, each corresponding to a half cycle of the clock, while shifting the pulses, thereby outputting scanning signals which are different from each other in timing by one clock to the respective scanning signal lines GL1 to GLn.

The following description explains an arrangement and operation of the shift register 1 of the present embodiment used in the data signal line drive circuit 14.

As illustrated in FIG. 1, the shift register 1 includes the flip-flop section 2 and the malfunction prevention section 3. In each of the stages of the flip-flop section 2, a set-reset type flip-flop ("SR-FF" in FIG. 1) 21 is provided. Moreover, in each of the stages of the malfunction prevention section 3, a malfunction prevention circuit 22 is provided. Note that, in other words, the set-reset type flip-flop (hereinafter referred to as flip-flop) 21 is provided in each of the stages of the shift register 1, and one malfunction prevention circuit 22 is provided corresponding to a flip-flop 21 whose output signal Q (Q1, Q2, ...) is inputted to the malfunction prevention circuit 22. To the shift register 1, the start pulse SSP and the two clock signals SCK and SCKB whose phases are different from each other are inputted.

In response to the start pulse SSP inputted to a flip-flop 21-1 in a first stage placed at the leftmost of FIG. 1, from left to right, the flip-flop section 2 outputs output signals Q (Q1, Q2, ...) in synchronism with the clock signals SCK and SCKB.

When a set signal inputted to an S terminal becomes active, the flip-flop 21 which is a set-reset type is set, and an output signal Q (Q1, Q2, ...) from a Q terminal becomes High (High level). Even when the set signal becomes inactive, a state of the output is maintained. When a reset signal inputted to an R terminal becomes active, the flip-flop 21 is reset, and the output signal Q becomes Low (Low level). Even when the reset signal becomes inactive, a state of the output is maintained until when the set signal becomes active again.

In the flip-flops 21, the start pulse SSP is inputted as the set signal to the flip-flop 21-1 which is in a first stage placed at the leftmost of FIG. 1. To each of the flip-flops 21 in and after a second stage, an output signal X (X1, X2, ...) is inputted as the set signal, the output signal X (X1, X2, ...) outputted from a malfunction prevention circuit (corresponding malfunction prevention circuit 22) to which the output signal Q (Q1, Q2, ...) from a flip-flop 21 in a stage before a stage of the flip-flop 21 to which the output signal X (X1, X2, ...) is inputted. Moreover, to each of the flip-flops 21, an output signal X (X1, X2, ...) is inputted as the reset signal, the output signal X (X1, X2, ...) outputted from a malfunction prevention circuit 22 corresponding to the flip-flop 21 in a stage after a stage of the flip-flop 21 to which the output signal X (X1, X2, ...) is inputted.

The malfunction prevention section 3 prevents the shift register from malfunctioning, even in cases where there is a period when the clock signal SCK and the clock signal SCKB are out of phase, and the waveforms of the clock signals SCK and SCKB overlap with each other and are High. The malfunction prevention circuit 22 includes a phase difference detection section 23 and a waveform timing forming section 24.

The phase difference detection section 23 removes, from the waveform of one clock signal (SCK or SCKB) supplied to the flip flop 21 in the next stage, a portion where the waveform of one clock signal (SCK or SCKB) overlaps with the waveform of another clock signal (SCKB or SCK), thereby generating a non-overlapping clock signal. That is, the phase difference detection section 23 (i) detects the waveform of the clock signal SCK and the waveform of the clock signal SCKB, and (ii) extracts (generates) a waveform where the waveform of the clock signal SCK and the waveform of the clock signal SCKB do not overlap with each other, and (iii) generates a new clock signal (non-overlapping clock signal).

Clock signals generated in phase difference detection sections 23 in odd stages are different from clock signals generated in phase difference sections 23 in even stages. A phase difference detection section 23a used in an odd stage generates an output signal A1, A3, or the like as a clock signal for the odd stage. The output signal A1, A3, or the like is generated by removing, from the clock signal SCK, portions where both the clock signal SCK and the clock signal SCKB are High, that is, shifted portions (see FIG. 4). A phase difference detection section 23b used in an even stage generates an output signal A2, A4, or the like as a clock signal for the even stage. The output signal A2, A4, or the like is generated by removing, from the clock signal SCKB, portions where both the clock signal SCK and the clock signal SCKB are High, that is, shifted portions (see FIG. 4). In this way, new clock signals are generated, so that periods when the output signal A1, A3, or the like for the odd stage is High do not overlap with periods when the output signal A2, A4 or the like for the even stage is High (see FIG. 4).

Each of the phase difference detection sections 23a and 23b is, for instance, arranged such as a phase difference detection section 23(1) that is composed of a nor circuit NOR1 and an inverter INV1. In this case, in each of phase difference detection sections 23(1)a in the odd stages, the clock signal SCKB is inputted directly to the nor circuit NOR1, and the clock signal SCK is inverted by the inverter INV1 and inputted to the nor circuit NOR1. Therefore, the nor circuit NOR1 outputs a signal which is High when the clock signal SCK is High and the clock signal SCKB is Low. The signal thus outputted is the output signal A1, A3, or the like (see FIG. 4).

Meanwhile, each of phase difference detection sections 23(1)b in the even stages functions inversely as compared with the above case. That is, the clock signal SCK is inputted directly to the nor circuit NOR1, and the clock signal SCKB is inverted by the inverter INV1 and inputted to the nor circuit NOR1. Therefore, the nor circuit NOR1 outputs a signal which is High when the clock signal SCK is Low and the clock signal SCKB is High. The signal thus outputted is the output signal A2, A4, or the like (see FIG. 4).

Figure 4:
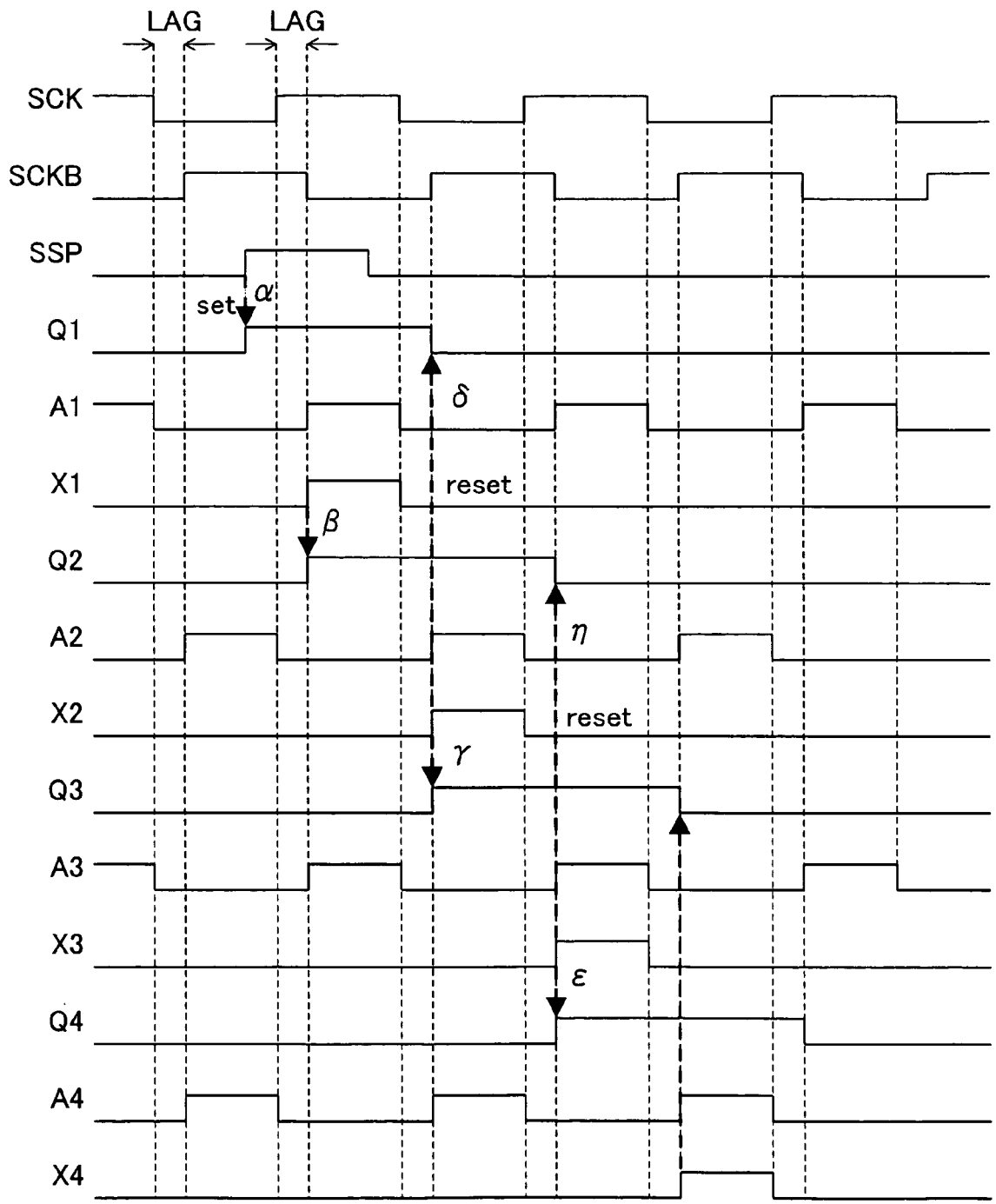
FIG. 4 is a timing diagram illustrating an operation of the shift register.

As illustrated in FIG. 4, in the case above, the output signal A1, A3, or the like supplied from the odd-stage phase different detection section 23(1)a and the output signal A2, A4, and the like supplied from the even-stage phase different detection section 23(1)b are such signals that intervals corresponding to the shifted portions between the clock signals SCK and SCKB are interposed between periods in which the output signal A1, A3, or the like is High and periods in which the output signal A2, A4, and the like is High, respectively.

In reference to FIG. 1, each of waveform timing forming sections 24 extracts a period when the output signal A (A1, A2, ...), which is a new clock signal generated in a corresponding phase difference detection section 23, is High, when the output signal Q (Q1, Q2, ...) from a corresponding flip-flop 21 is High. In this manner, the waveform timing forming section 24 generates the output signal X (X1, X2, ...) which is used as the set signal for a flip-flop in the following stage. The waveform timing forming sections 24 in odd stages and in even stages are arranged in the same way.

Moreover, each of the output signals X (X1, X2, . . . ) from each of the waveform timing forming sections 24 is outputted as an output signal of the shift register 1. The output signal is also inputted to a flip-flop 21 in a preceding stage in order to reset the flip-flop 21 in the preceding stage. That is, the output signal Q of the flip-flop 21 in the preceding stage maintains Low until when the next set signal becomes active.

Each of the waveform timing forming sections 24 is, for instance, arranged such as a waveform timing forming section 24(1) that is composed of a nand circuit NAND1 and an inverter INV2. To the nand circuit NAND1, an output signal A (A1, A2, A3, . . . ) from a corresponding phase difference detection section 23 and an output Q (Q1, Q2, Q3, . . . ) from a corresponding flip-flop 21 are inputted. An output from the nand circuit NAND1 is inverted by the inverter INV2, and outputted as the output signal X (X1, X2, . . . ). Only while both the output A and the output Q, which are inputted to the nand circuit NAND1, are High, the output of the nand circuit NAND1 becomes Low. Therefore, in each of the waveform timing forming sections 24(1), only while both the output A and the output Q are High, the inverter INV2 outputs the output signal X (X1, X2, . . . ) which is High (see FIG. 4)

In reference to the timing diagram of FIG. 4, the following description explains the operation of the shift register 1 arranged as above. When the start pulse SSP is inputted to the flip-flop 21-1 in the first stage as the set signal, the flip-flop 21-1 in the first stage is set ($\alpha$), and the output signal Q1 becomes High (High level).

The output signal Q1 from the flip-flop 21-1 becomes High, so that a malfunction prevention circuit 22-1 corresponding to the flip-flop 21-1 in the first stage, more specifically, the waveform timing forming section 24 outputs the output signal X1 which is High, while the output signal A1 generated in the phase difference detection section 23a of the malfunction prevention circuit 22-1 is High. The output signal X1 is outputted as the output from the first stage of the shift register 1.

Moreover, the output signal X1 is inputted to a flip-flop 21-2 in a second stage as the set signal. With this, the flip-flop 21-2 in the second stage is set ($\beta$), and as in the above case, an output signal Q2 from the flip-flop 21-2 in the second stage becomes High. The output signal Q2 from the flip-flop 21-2 is High, so that a malfunction prevention circuit 22-2 corresponding to the flip-flop 21-2 in the second stage, more specifically, the waveform timing forming section 24 outputs the output signal X2 which is High, while the output signal A2 generated in the phase difference detection section 23b of the malfunction prevention circuit 22-2 is High. The output signal X2 is outputted as the output from the second stage of the shift register 1.

Then, as in the above case, the output signal X2 is inputted to a flip-flop 21-3 in a third stage as the set signal. Therefore, the flip-flop 21-3 in the third stage is set ($\gamma$), and while the output signal A3 is High, a corresponding malfunction prevention circuit 22-3 outputs the output signal X3 which is High. The output signal X3 is outputted as the output from the third stage of the shift register 1. Moreover, the output signal X2 is inputted to the flip-flop 21-1 in the preceding stage, that is, in the first stage. Therefore, the flip-flop 21-1 in the first stage is reset ($\delta$), and the output signal Q1 becomes Low level.

As in the above case, the output signal X3 is inputted to a flip-flop 21-4 in a fourth stage as the set signal. Therefore, the flip-flop 21-4 in the fourth stage is set ($\epsilon$). The output signal X3 is also inputted as the reset signal to the flip-flop 21-2 in a preceding stage, that is, in the second stage. Therefore, the flip-flop 21-2 in the second stage is reset ($\eta$).

In each of the stages of the shift register 1, the above-mentioned set-reset operation of the flip flop 21 and the output operation of the output signal X (X1, X2, . . . ) from the malfunction prevention circuit 22 are successively carried out, so that, (i) from the odd stages of the shift register, the output signals X1, X3, and the like are outputted by utilizing periods when the output signal A1, A3, and the like, which are the clock signals for the odd stages, are High, and (ii) from the even stages of the shift register, the output signals X2, X4, and the like are outputted by utilizing periods when the output signals A2, A4, and the like, which are the clock signals for the even stages, are High. Note that, the period when the output signal A1, A3, or the like is High do not overlap with the period when the output signal A2, A4, or the like is High. As a result, the output signals X (X1, X2, . . . ) which do not overlap with each other are outputted successively.

The output signal X (X1, X2, . . . ) are set as the set signal of the flip-flop 21 in a following stage. In this way, even if the clock signals SCK and SCKB are out of phase, the shift register 1 functions properly without malfunctioning.

The following description explains another arrangement of the malfunction prevention circuit 22. As described above, the malfunction prevention circuit 22 is provided for preventing the shift register 1 from malfunctioning even when the clock signals SCK and SCKB are out of phase so that there is a period when both the clock signals SCK and SCKB are High.

The shift register of the present invention includes the phase difference detection section 23 and the waveform timing forming section 24. In concrete terms, the phase difference detection section 23 generates the new clock signal in which overlapping portions of the clock signals SCK and SCKB are removed. In the meantime, the waveform timing forming section 24 extracts a period when the output signal A (A1, A2, A3, . . . ), which is the new clock signal generated in the corresponding phase difference detection section 23, is High, while the output signal Q (Q1, Q2, . . . ) from the corresponding flip-flop 21 is High, and the waveform timing forming section 24 generates the output signal X (X1, X2, . . . ) which is used as the set signal for a flip-flop in the following stage.

Figure 5:
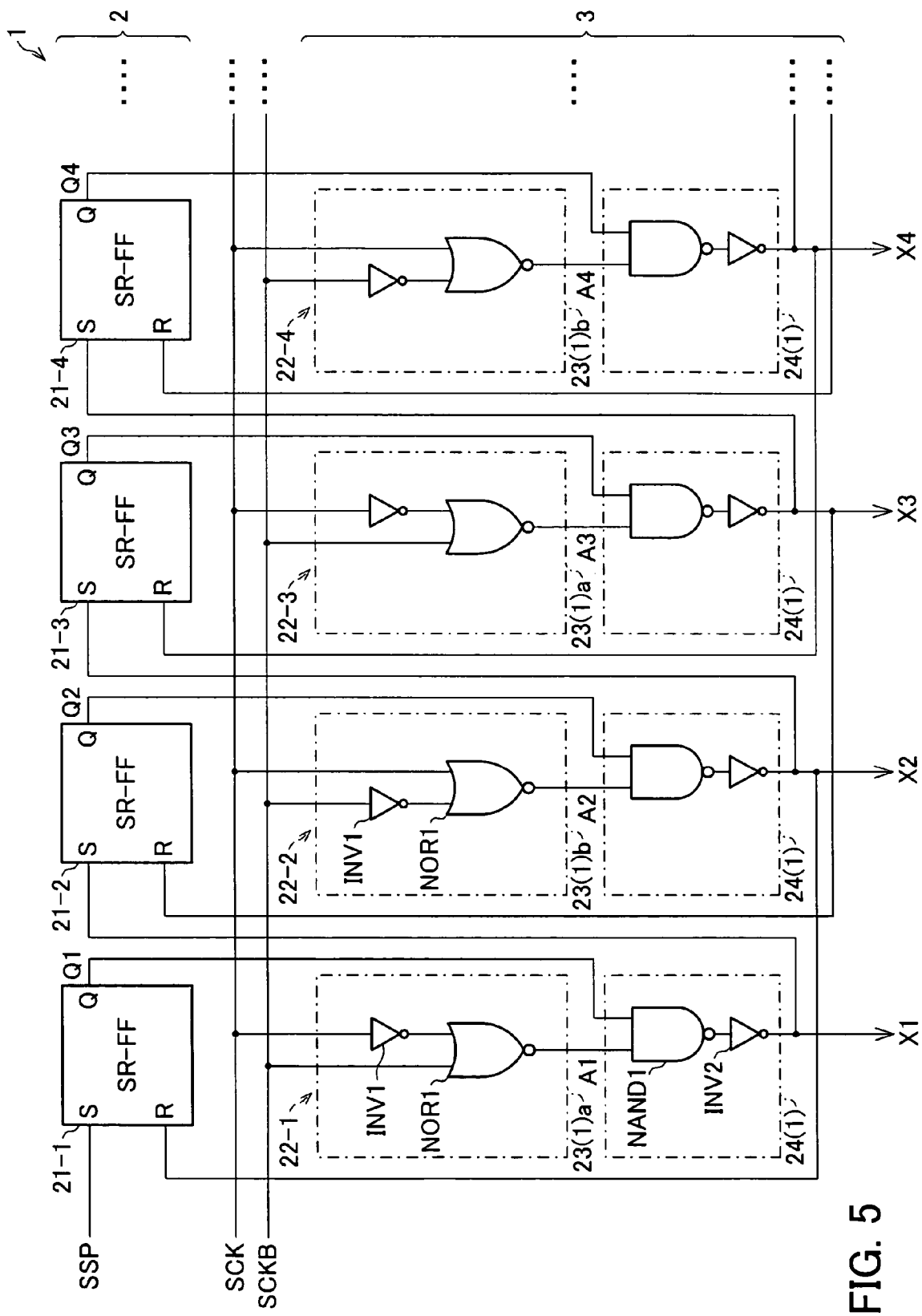
FIG. 5 is a circuit diagram illustrating one circuit arrangement which can realize the shift register.

The phase difference detection section 23 and the waveform timing forming section 24 can be arranged variously by using logic circuits and analog switches (analog means). In FIG. 5, the phase difference detection section 23(1) is composed of the nor circuit NOR1 and the inverter INV1, and the waveform timing forming section 24(1) is composed of the nand circuit NAND1 and the inverter INV2.

Figure 6:
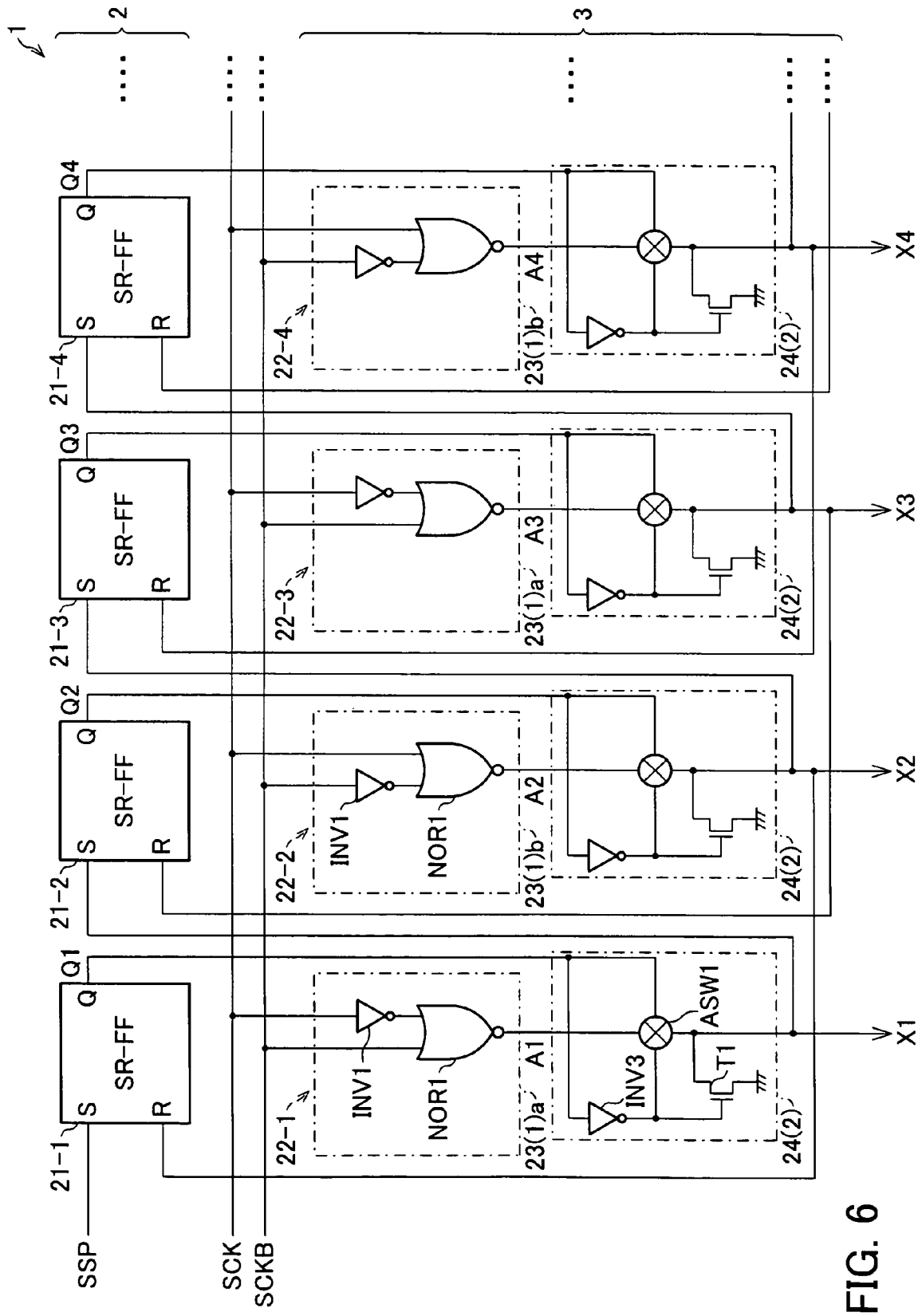
FIG. 6 is a circuit diagram illustrating another circuit arrangement which can realize the shift register.
Figure 7:
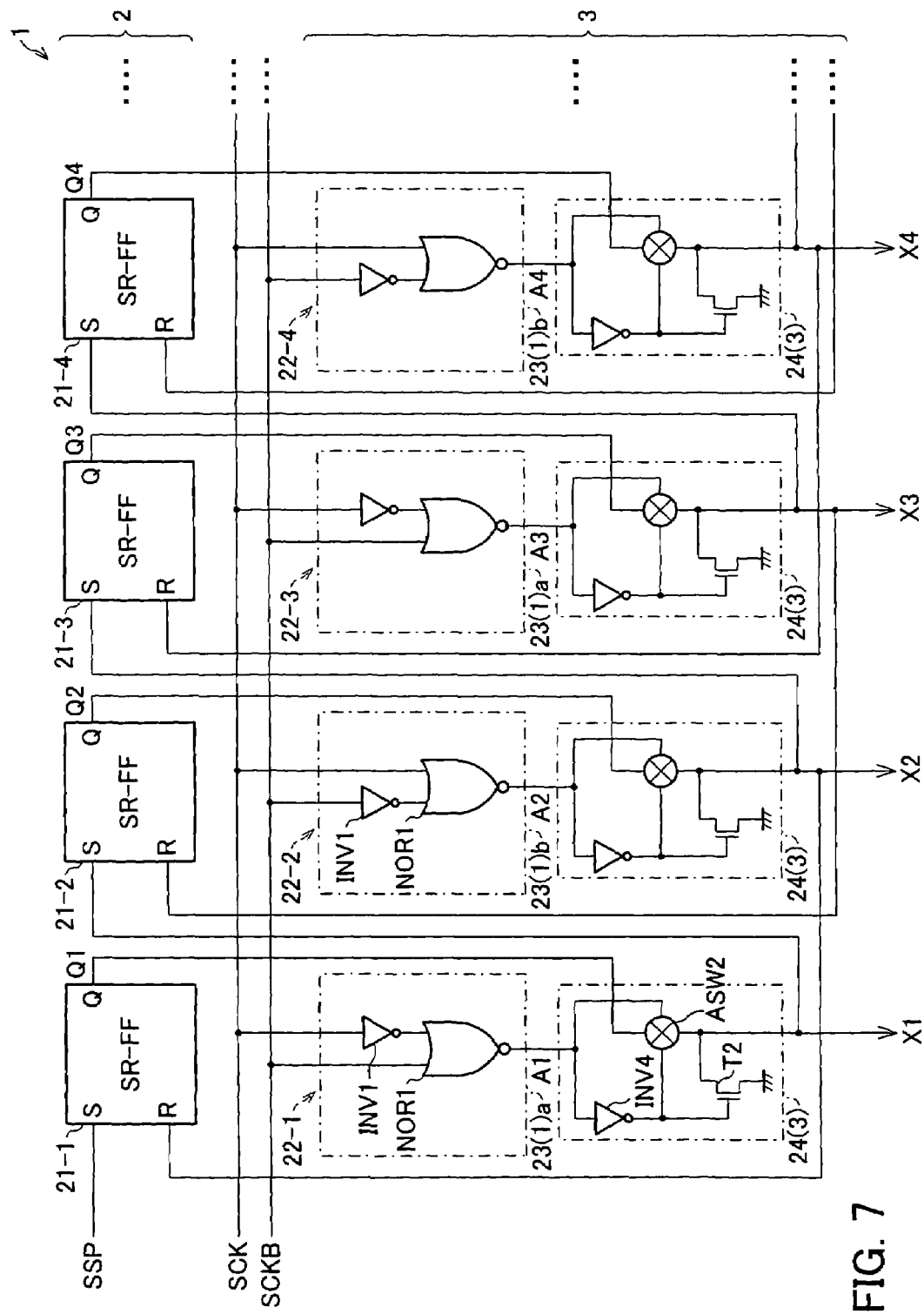
FIG. 7 is a circuit diagram illustrating still another circuit arrangement which can realize the shift register.

FIG. 6 illustrates an arrangement of the shift register 1 including a waveform timing forming section 24(2) in which the analog switch is provided. FIG. 7 illustrates another arrangement of the shift register 1 including a waveform timing forming section 24(3) in which the analog switch is provided.

The waveform timing forming section 24(2) illustrated in FIG. 6 directly outputs the output signal A (A1, A2, . . . ), which is outputted from the phase difference detection section 23(1), as the output signal X (X1, X2, . . . ). While the output signal Q (Q1, Q2, . . . ) from the flip-flop 21 is High, an analog switch ASW1 is in an ON state, and the output signal A (A1, A2, . . . ) is allowed to pass through the waveform timing forming section 24(2).

Meanwhile, the waveform timing forming section 24(3) illustrated in FIG. 7 controls ON/OFF of an analog switch ASW2 by the output signal A (A1, A2, . . . ) outputted from the phase difference detection section 23(1). Only while the output signal A (A1, A2, . . . ) is High, a High output signal Q (Q1, Q2, ... ) from the flip-flop 21 is allowed to pass through the waveform timing forming section 24(3), and this High output signal Q (Q1, Q2, ... ) is outputted as the output signal X (X1, X2, ... ).

Note that, the inverter INV3 supplies control signals opposite to each other to gates of a PMOS transistor and an NMOS transistor which compose the analog switch ASW1 and are provided in parallel. On the other hand, the inverter INV4 supplies control signals opposite to each other to gates of a PMOS transistor and an NMOS transistor which compose the analog switch ASW2 and are provided in parallel.

Moreover, an NMOS transistor T1 is provided for stabilizing an output terminal of the analog switch ASW1 when the analog switch ASW1 is OFF (an NMOS transistor T2 is provided for stabilizing an output terminal of the analog switch ASW2 when the analog switch ASW2 is OFF). When the analog switch ASW1 is ON, a High signal is outputted (When the analog switch ASW2 is ON, a High signal is outputted). When the analog switch ASW1 is OFF, it is necessary to make the output terminal of the analog switch ASW1 to be Low (pull-down), so that the NMOS transistor T1 is used (When the analog switch ASW2 is OFF, it is necessary to make the output terminal of the analog switch ASW2 to be Low (pull-down), so that the NMOS transistor T2 is used). Note that, in cases where a Low signal is outputted when the analog switch ASW1 is ON, it is necessary to make the output terminal of the analog switch ASW1 to be High (pull-up) by using the PMOS transistor (in cases where a Low signal is outputted when the analog switch ASW2 is ON, it is necessary to make the output terminal of the analog switch ASW2 to be High (pull-up) by using the PMOS transistor).

Figure 8:
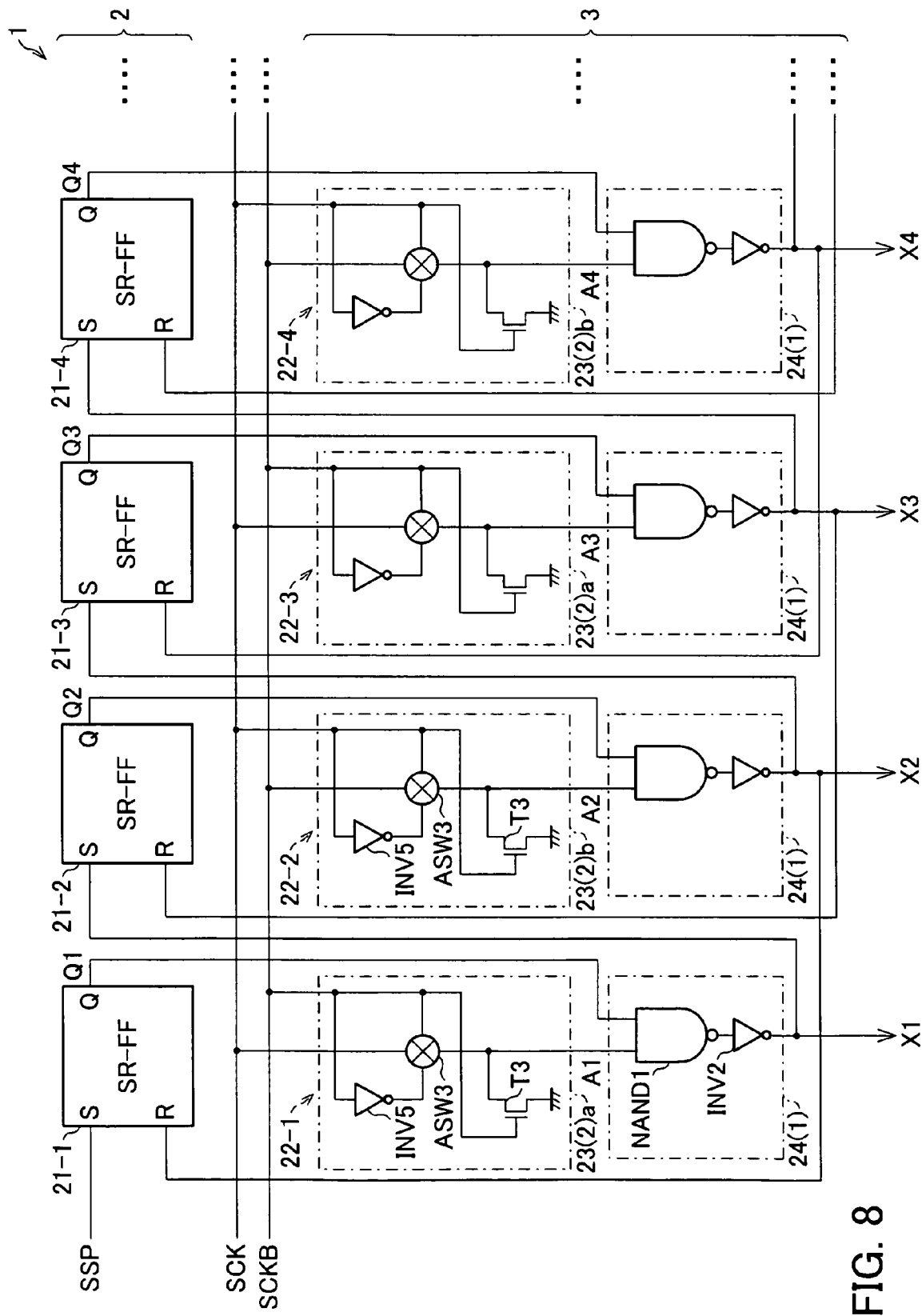
FIG. 8 is a circuit diagram illustrating yet another circuit arrangement which can realize the shift register.
Figure 9:
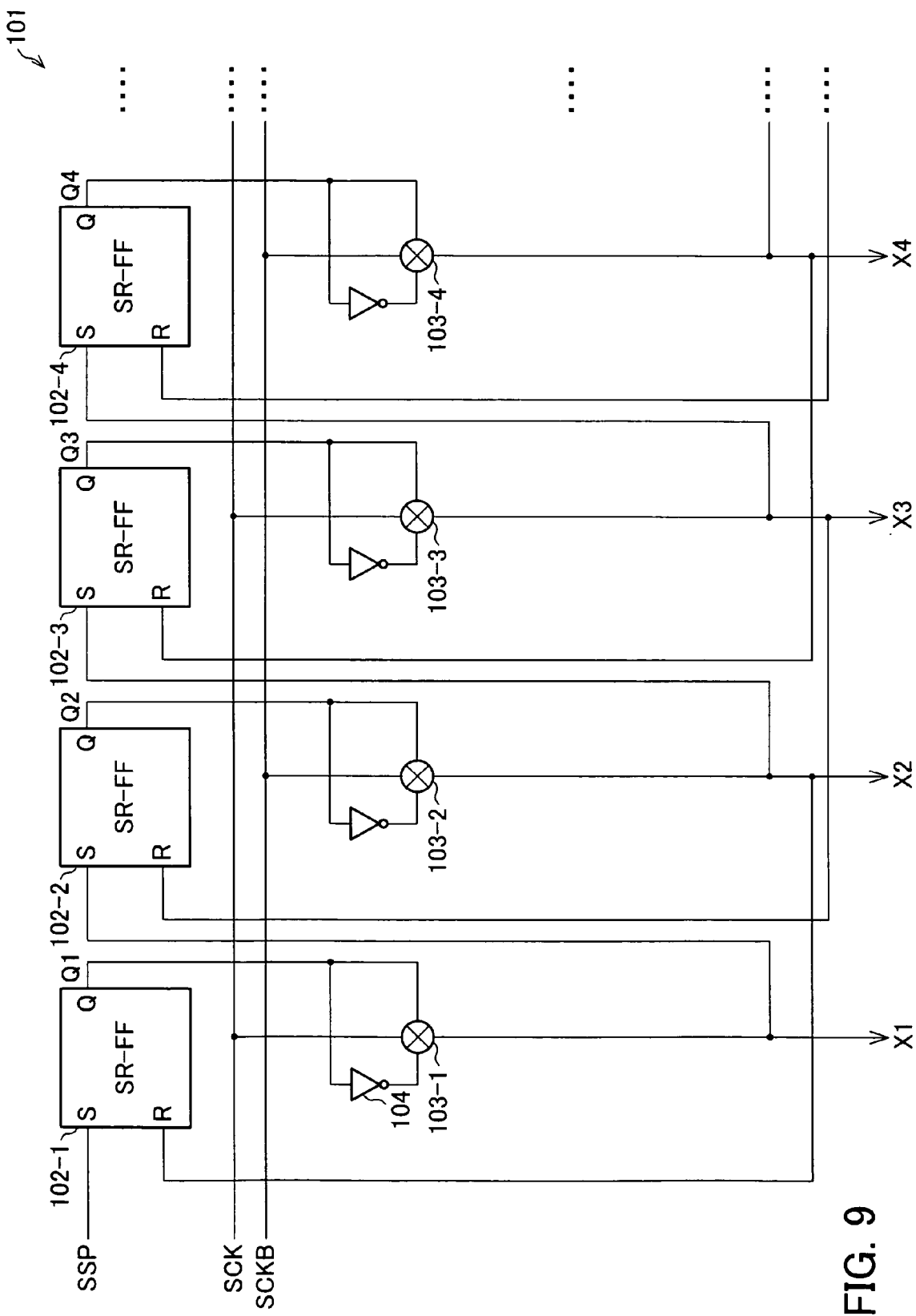
FIG. 9 is a circuit diagram illustrating an arrangement of a conventional shift register used in a data signal line drive circuit.
Figure 10:
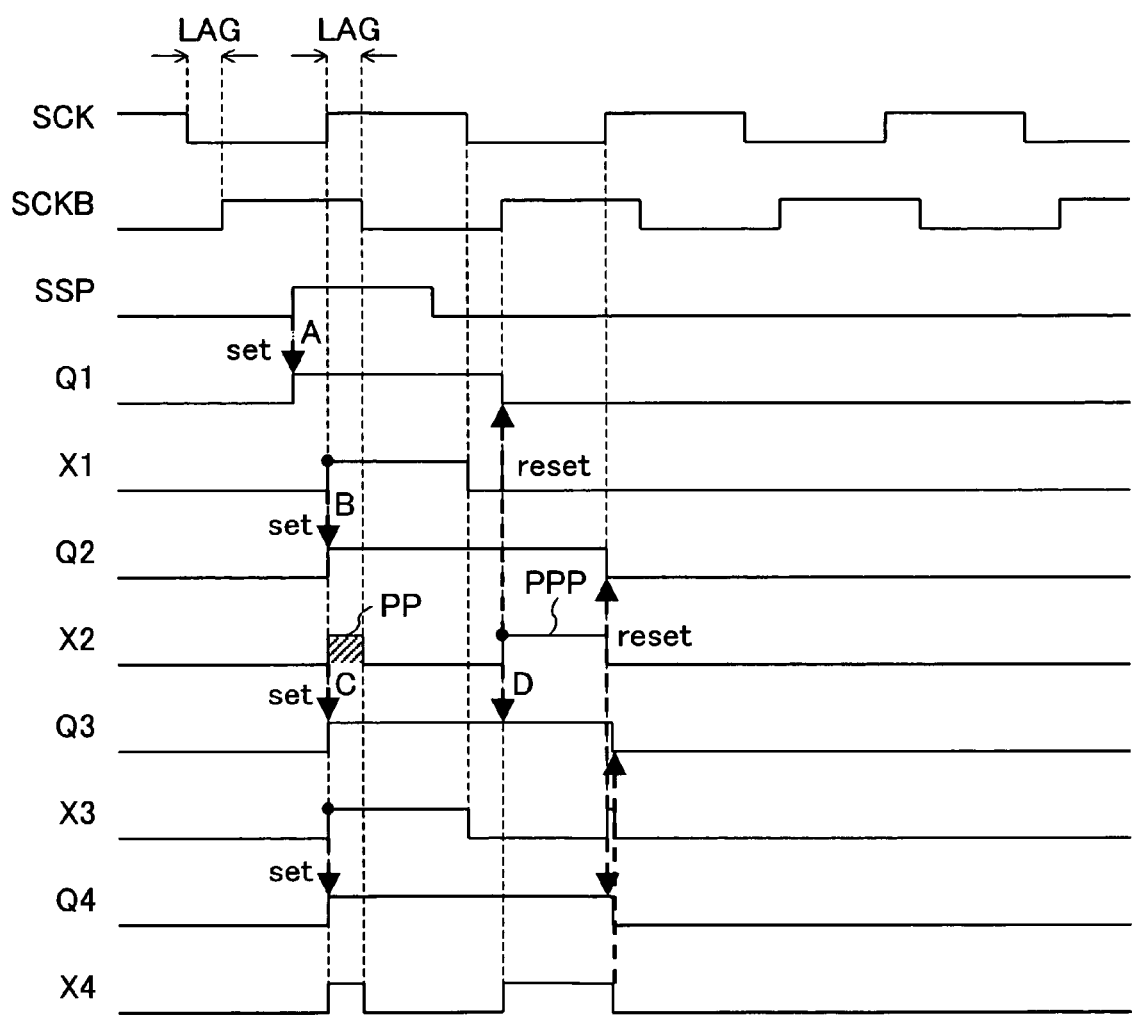
FIG. 10 is a timing diagram illustrating each operation of the conventional shift register.

Moreover, FIG. 8 illustrates yet another arrangement of the shift register 1 including the phase difference detection section 23(2) in which the analog switch is provided. In FIG. 8, in each of phase difference detection sections 23(2)a in the odd stages, the clock signal SCKB controls ON/OFF of an analog switch ASW3. With this, only while the clock signal SCKB is Low, the clock signal SCK passes through the phase difference detection section 23(2)a, and this signal is outputted as the output signal A1, A3, or the like. Meanwhile, in each of phase difference detection sections 23(2)b in the even stages, the clock signal SCK controls ON/OFF of an analog switch ASW3. With this, only while the clock signal SCK is Low, the clock signal SCKB passes through the phase difference detection section 23(2)b, and this signal is outputted as the output signal A2, A4, or the like.

Note that, also in this case, an inverter INV 5 supplies control signals opposite to each other to gates of a PMOS transistor and a NMOS transistor which compose the analog switch ASW3 and are provided in parallel. Like the NMOS transistors T1 and T2, an NMOS transistor T3 is provided for stabilizing the output terminal of the analog switch ASW3 by the pull-down, when the analog switch ASW3 is OFF. Moreover, the phase difference detection section 23(2) composed of the analog switch in FIG. 8 may be combined with any one of the waveform timing forming sections 24(2) and 24(3) which are composed of the analog switch and shown in FIGS. 6 and 7.

Note that, according to the shift register 1 described above, the output signal X (X1, X2, ... ) from the malfunction prevention circuit 22 is outputted as the output from the shift register 1. However, the output from the shift register 1 do not have to be the output X (X1, X2, ... ). The shift register may be structured such that the output signal Q (Q1, Q2, ... ) from each of the flip-flops 21 is the output of the shift register 1, and a sampling signal is generated therefrom.

Moreover, the output signal X (X1, X2, ... ) from each of the malfunction prevention circuits 22 is used as the set signal for the flip-flop 21 in the following stage, so that it is possible to surely prevent the shift register 1 from malfunctioning. Meanwhile, it is not indispensable to use the output signal X (X1, X2, ... ) as the reset signal of the flip-flop in the preceding stage. For example, an output signal Q from the flip-flop 21 in an N stage may be used for resetting the flip-flop 21 in an N-1 stage.

In addition, a flip-flop 21 reset by the output signal Q from the flip-flop 21 in the N stage, or a flip-flop 21 reset by the output signal X outputted by using the output signal Q from the flip-flop 21 in the N stage does not have to be the flip-flop 21 in the N-1 stage, but may be the flip-flop 21 in a stage before the N-1 stage. Note that, a period when the output signal Q from the flip-flop 21 is High becomes long by resetting the flip-flop in the stage before the N-1 stage. Therefore, when the output of the shift register is the output signal X (X1, X2, ... ), a plurality of pulses are outputted, and it is possible to use, for example, voltage write for pre-charge.

Moreover, in the present case, the clock signals SCK and SCKB, which are inverted with each other, are used as two kinds of clock signals whose waveforms are compared and overlapping portions are removed by the phase difference detection section 23. However, the signals whose overlapping portions are removed do not have to be inverted with each other. The signals are two clock signals which are inputted to the shift register at different timings (which are out of phase with each other), and the waveforms may be compared between the clock signals which may malfunction when the clock signals overlap with each other.

Moreover, in the display device 11 in the present embodiment, the scanning signal line drive circuit 13, the data signal line drive circuit 14, and the display section 12 composed of a plurality of the pixels 16 are formed on the same substrate.

That is, the scanning signal line drive circuit 13, the data signal line drive circuit 14, and the display section 12 are formed on an insulating substrate (for example, a glass substrate 51) (driver monolithic arrangement). In many cases, as the insulating substrate (substrate), a sapphire substrate, a quartz substrate, a non-alkali glass, or the like is used.

As described above, the scanning signal line drive circuit 13 and the data signal line drive circuit 14 are monolithically formed on the glass substrate 51 on which the display section 12 is also formed, so that it is possible to reduce steps for manufacturing and capacity of wiring. Moreover, as compared with a display device using an external IC as a driver, the number of input terminals becomes small. As a result, it is possible to reduce costs for mounting components on the glass substrate 51 and also possible to reduce the possibility of producing defective products which may be produced when mounting the components. Therefore, it is possible to reduce manufacturing costs and mounting costs of drive circuits, and also possible to improve reliability of the drive circuits.

Moreover, in the present display device, a thin film transistor is used as the pixel transistor SW (see FIG. 3), and each of the scanning signal line drive circuit 13 and the data signal line drive circuit 14 includes the thin film transistor. In order to integrate more pixels 16 and to expand a display area, a polycrystalline silicon thin film transistor is adopted as the thin film transistor.

By using the above-described polycrystalline silicon thin film transistor, it is possible to produce, by following substantially the same manufacturing steps as the manufacturing steps of the pixel 16, the scanning signal line drive circuit 13 and the data signal line drive circuit 14, both of which have a practical driving ability, on the glass substrate 51 on which the display section 12 is formed.

To solve the above-described problem, a shift register in accordance with the present invention in which a plurality of set-reset type flip-flops are provided and to which two clock signals whose phases are different from each other are inputted, each of the plurality of the set-reset type flip-flops includes: a phase difference detection section generating a non-overlapping clock signal obtained by removing, from a waveform of a clock signal inputted to a set-reset type flip-flop in a following stage, a portion where the waveform of the clock signal overlaps with a waveform of another clock signal; and a waveform timing forming section outputting a signal to the set-reset type flip-flop in the following stage as a set signal by using the non-overlapping clock signal generated in the phase difference detection section and an output signal Q from a set-reset type flip-flop in a current stage, the signal being extracted by the non-overlapping signal while the output signal Q from the set-reset type flip-flop in the current stage is outputted.

According to the above, the phase difference detection section provided in each stage removes, from the waveform of a clock signal inputted to the flip-flop in the following stage, a portion where the waveform of the clock signal inputted to the flip-flop in the following stage overlaps with the waveform of another clock signal, thereby generating the non-overlapping clock signal. Therefore, even when two clock signals are out of phase, and the waveforms of the two clock signals are overlapping with each other (both clock signals may be High level, or may be Low level), the phase difference detection section surely removes the portion where the waveforms of the two signals overlaps with each other, thereby generating a clock signal having no overlapping portions (non-overlapping signal).

Then, the waveform timing forming section outputs a signal to the flip-flop in the following stage by using the non-overlapping clock signal and an output signal from the flip-flop in a current stage. The signal outputted to the flip-flop in the following stage is extracted from the non-overlapping signal while the output signal of the flip-flop is outputted.

Therefore, even when two clock signals are out of phase, and some portions of the waveforms of the two clock signals are overlapping with each other, the portions where the waveforms of the two signals overlaps with each other are surely removed in each stage, thereby generating a clock signal having no overlapping portion (non-overlapping signal). Each of the flip-flops therefore functions by using the non-overlapping clock signal, so that a malfunction (for example, a plurality of flip-flops function at the same time) is prevented. It is possible to carry out a shift operation properly.

In the shift register in accordance with the present invention, the phase difference detection section or the waveform timing forming section can be composed of a logic circuit or a switching means.

In the shift register in accordance with the present invention, the waveform timing forming section can be structured such that the waveform timing forming section outputs a signal as an output signal X, the signal being extracted from the non-overlapping signal while the output signal Q is outputted from the set-reset type flip-flop in the current stage.

In the shift register in accordance with the present invention, the set-reset type flip-flop in the current stage may be reset by the signal extracted from the non-overlapping signal while the output signal Q is outputted from the set-reset type flip-flop in a following stage.

In the shift register in accordance with the present invention, the two clock signals whose phases are different from each other may be 180° out of phase.

In the shift register in accordance with the present invention, the phase difference detection section may be structured such that the phase difference detection section (i) detects an overlapping period when both of the two clock signals whose phases are different from each other are High level or Low level, and (ii) generates, in the overlapping period, a removal clock signal by which the set-reset type flip-flop becomes inactive.

To solve the above problem, a display device in accordance with the present invention includes (i) a display section, composed of a plurality of pixels, (ii) a data signal line drive circuit, being connected to a plurality of data signal lines and supplying an image data, which is written to the pixels, to each of the data signal lines, and (iii) a scanning signal line drive circuit, being connected to a plurality of scanning signal lines and supplying a scanning signal to each of the scanning signal lines, the scanning signal controlling writing of the image data to the pixels, the display device being characterized in that the shift register of the present invention is provided in at least one of the data signal line drive circuit and the scanning signal line drive circuit.

According to the above arrangement, by using the shift register of the present invention, it is possible to provide a display device in which display troubles caused by the above-described malfunction of the shift register is prevented.

In the display device of the present invention, at least one of the data signal line drive circuit and the scanning signal line drive circuit is preferably formed on a substrate on which the pixels are formed. In this way, wirings between the data signal line drive circuit and each of the pixels, or wirings between the scanning signal line drive circuit and each of the pixels are provided on the same substrate, and it is not necessary to form the wirings outside the substrate. As a result, even when the number of the data signal lines and the number of the scanning signal lines are increased, the number of the signal lines formed outside the substrate does not change, and it is not necessary to add signal lines provided outside the substrate. Therefore, it is possible to prevent the capacity of each of the signal lines from increasing, and also possible to prevent a degree of integration from lowering. In addition, it is possible to simplify the manufacturing process.

In the display device of the present invention, an active element, composing at least one of the data signal line drive circuit and the scanning signal line drive circuit, is preferably a polycrystalline silicon thin film transistor. In this way, it is easy to expand the display area.

In case of the polycrystalline silicon thin film, it is easier to expand the display area as compared with a single crystal silicon. However, the polycrystalline silicon transistor is inferior to a single crystal silicon transistor in terms of transistor properties such as mobility and threshold. Therefore, when circuits are produced by using the single crystal silicon transistor, it is difficult to expand the display area. On the other hand, when circuits are produced by using the polycrystalline silicon thin film transistor, driving abilities of the circuits are bad. Note that, when two drive circuits and the pixels are provided on different substrates, it is necessary to connect these substrates by signal lines. This results in an increase of the manufacturing steps and an increase of capacity of each of the signal lines.

Therefore, by providing a switching element made of the polycrystalline silicon thin film transistor, it is possible to easily expand the display area. Moreover, by using the shift register of the present invention, it is possible to prevent the display troubles caused by the above-described malfunction of the shift register.

INDUSTRIAL APPLICABILITY

The shift register of the present invention can be suitably used in, for example, a data signal line drive circuit or a scanning signal line drive circuit in a display device such as an image display device.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A shift register including a plurality of sequential stages, each stage comprising:
    a flip-flop; and
    a malfunction prevention circuit configured to remove overlap between two received clock signals and output a signal to a following one of the sequential stages.

2. The shift register as set forth in claim 1, wherein the two received clock signals include phases that are different from each other.

3. The shift register of claim 2, wherein the two received clock signals are out of phase by 180° from each other.

4. The shift register of claim 1, wherein the malfunction prevention section includes:
    a phase difference detection section to remove the overlap between the two received clock signals; and
    a waveform timing forming section to output the signal to the following one of the sequential stages.

5. The shift register as set forth in claim 4, wherein said phase difference detection section and said waveform timing forming section is composed of a logic circuit.

6. The shift register as set forth in claim 4, wherein said phase difference detection section and said waveform timing forming section is composed of switching means.

7. The shift register as set forth in claim 4, wherein said phase difference detection section
    detects an overlapping period in which both of the received two clock signals are High level or Low level, and
    generates, in an overlapping period, a removal clock signal by which the set-reset type flip-flop is caused to be inactive.

8. The shift register of claim 4, wherein the flip-flop is a set-reset type flip-flop.

9. The shift register of claim 8, wherein the waveform timing forming section is configured to output the signal as an output signal X, the signal which is the non-overlapping signal being extracted, while an output signal Q from the set-rest type flip-flop in the current stage is outputted.

10. The shift register of claim 8, wherein the set-reset type flip-flop in the current state is reset by the output signal X in the following stage.

11. A display device comprising:
    a display section, composed of a plurality of pixels;
    a data signal line drive circuit, being connected to a plurality of data signal lines and supplying an image data, which is written to the pixels, to each of the data signal lines;
    a scanning signal line drive circuit, being connected to a plurality of scanning signal lines and supplying a scanning signal to each of the scanning signal lines, the scanning signal controlling writing of the image data to the pixels; and
    a shift register, provided in at least one of said data signal line drive circuit and said scanning signal line drive circuit,
    the shift register including a plurality of sequential stages, each stage including:
    a flip-flop; and
    a malfunction prevention circuit configured to remove overlap between two received clock signals and output a signal to a following one of the sequential stages.

12. The display device as set forth in claim 11, wherein at least one of said data signal line drive circuit and said scanning signal line drive circuit is formed on a substrate on which the pixels are formed.

13. The display device as set forth in claim 11, wherein an active element, composing at least one of said data signal line drive circuit and said scanning signal line drive circuit, is a polycrystalline silicon thin film transistor.

14. The shift register of claim 11, wherein the malfunction prevention section includes:
    a phase difference detection section to remove the overlap between the two received clock signals; and
    a waveform timing forming section to output the signal to the following one of the sequential stages.

15. The shift register of claim 14, wherein the flip-flop is a set-reset type flip-flop.

16. The shift register of claim 15, wherein the waveform timing forming section is configured to output the signal as an output signal X, the signal which is the non-overlapping signal being extracted, while an output signal Q from the set-rest type flip-flop in the current stage is outputted.

17. The shift register of claim 15, wherein the set-reset type flip-flop in the current state is reset by the output signal X in the following stage.

* * * * *